United States Patent
Tang et al.

(10) Patent No.: US 7,659,143 B2
(45) Date of Patent: Feb. 9, 2010

(54) DUAL-CHIP INTEGRATED HEAT SPREADER ASSEMBLY, PACKAGES CONTAINING SAME, AND SYSTEMS CONTAINING SAME

(75) Inventors: Jiamiao Tang, Shanghai (CN); Daoqiang Lu, Chandler, AZ (US); Jiangqi He, Gilbert, AZ (US); Xiang Yin Zeng, Shanghai (CN)

(73) Assignee: Intel Corporation, Santa Clara, CA (US)

( * ) Notice: Subject to any disclaimer, the term of this patent is extended or adjusted under 35 U.S.C. 154(b) by 52 days.

(21) Appl. No.: 11/537,522

(22) Filed: Sep. 29, 2006

(65) Prior Publication Data
US 2008/0079144 A1    Apr. 3, 2008

(51) Int. Cl.
*H01L 21/00*    (2006.01)

(52) U.S. Cl. ............... 438/107; 438/122; 257/E21.511

(58) Field of Classification Search .......... 438/106–127, 438/613–635
See application file for complete search history.

(56) References Cited

U.S. PATENT DOCUMENTS

| | | | |
|---|---|---|---|
| 6,424,533 B1 * | 7/2002 | Chu et al. .................. 361/719 |
| 6,709,898 B1 * | 3/2004 | Ma et al. .................... 438/122 |
| 7,109,581 B2 * | 9/2006 | Dangelo et al. ............. 257/720 |
| 7,305,839 B2 * | 12/2007 | Weaver, Jr. .................... 62/132 |
| 7,402,906 B2 * | 7/2008 | Rahman Khan et al. ...... 257/712 |
| 7,408,263 B2 * | 8/2008 | Meth ........................... 257/783 |
| 7,446,409 B2 * | 11/2008 | Yang ........................... 257/707 |
| 7,511,359 B2 * | 3/2009 | Tang et al. ................... 257/621 |
| 2007/0284730 A1 * | 12/2007 | Shi et al. ...................... 257/704 |
| 2008/0023665 A1 * | 1/2008 | Weiser et al. ................... 252/71 |
| 2008/0032449 A1 * | 2/2008 | Tan et al. ..................... 438/108 |
| 2008/0054448 A1 * | 3/2008 | Lu et al. ...................... 257/707 |
| 2008/0073776 A1 * | 3/2008 | Suh et al. ..................... 257/706 |

* cited by examiner

*Primary Examiner*—Savitri Mulpuri
(74) *Attorney, Agent, or Firm*—John N. Greaves

(57) ABSTRACT

A method includes mating a first heat spreader and a second heat spreader, such that the first heat spreader at a mating surface and second heat spreader at a mating surface become parallel and adjacent. The mated first heat spreader and second heat spreader have at least one convection channel disposed therebetween. A process includes placing a first die in a first die recess of the first heat spreader, and placing a second die on a second die site on the second heat spreader. The process includes reflowing thermal interface material between each die and respective heat spreader. A package is achieved by the method, with reduced thicknesses. The package can be coupled through a bumpless build-up layer. The package can be assembled into a computing system.

18 Claims, 9 Drawing Sheets

DUAL-CHIP INTEGRATED HEAT SPREADER ASSEMBLY, PACKAGES CONTAINING SAME, AND SYSTEMS CONTAINING SAME

TECHNICAL FIELD

Embodiments relate generally to a dual-chip level integration of devices.

TECHNICAL BACKGROUND

Processors and other integrated circuit chips can generate significant heat. During miniaturization efforts, not only are circuits being crowded into smaller geometries, but multiple chips are also being crowded into smaller packages.

BRIEF DESCRIPTION OF THE DRAWINGS

In order to depict the manner in which the embodiments are obtained, a more particular description of embodiments briefly described above will be rendered by reference to exemplary embodiments that are illustrated in the appended drawings. Understanding that these drawings depict only typical embodiments that are not necessarily drawn to scale and are not therefore to be considered to be limiting of its scope, the embodiments will be described and explained with additional specificity and detail through the use of the accompanying drawings in which.

DETAILED DESCRIPTION

Embodiments in this disclosure relate to a process for forming a die in a heat spreader recess. Embodiments also relate to methods of assembling a bumpless build-up layer after forming a die in a heat spreader recess.

The following description includes terms, such as upper, lower, first, second, etc. that are used for descriptive purposes only and are not to be construed as limiting. The embodiments of an apparatus or article described herein can be manufactured, used, or shipped in a number of positions and orientations. The terms "die" and "chip" generally refer to the physical object that is the basic workpiece that is transformed by various process operations into the desired integrated circuit device. A die is usually singulated from a wafer and wafers may be made of semiconducting, non-semiconducting, or combinations of semiconducting and non-semiconducting materials. A board is typically a resin-impregnated fiberglass structure acting as a mounting substrate for the die. A heat spreader in this disclosure is a thin structure that is dual-die-and-dual-heat spreader processed.

Reference will now be made to the drawings wherein like structures will be provided with like suffix reference designations. In order to show the structures of various embodiments most clearly, the drawings included herein are diagrammatic representations of integrated circuit structures. Thus, the actual appearance of the fabricated structures, for example in a photomicrograph, may appear different while still incorporating the essential structures of the illustrated embodiments. Moreover, the drawings show the structures necessary to understand the illustrated embodiments. Additional structures known in the art have not been included to maintain the clarity of the drawings.

Figure 1A:
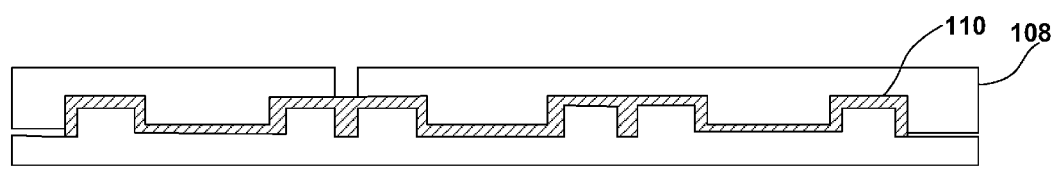
FIG. 1A is a cross-section elevation that illustrates a dual-chip heat-spreader forming processes according to an embodiment.

FIG. 1A is a cross-section elevation illustrating a dual-chip heat-spreader forming process according to an embodiment. A first heat spreader 110 is depicted as being formed in a structure 108, such as a mold chase. In an embodiment, the structure 108 is a stamping template.

Figure 1B:
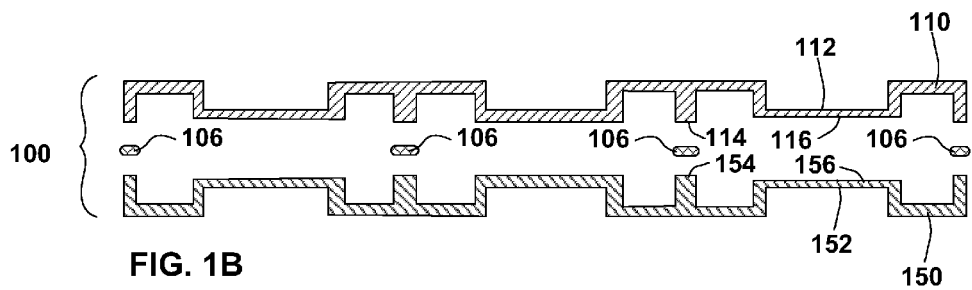
FIG. 1B is a cross-section, exploded-assembly elevation that further illustrates a mating process with the heat spreader depicted in FIG. 1A according to an embodiment.

FIG. 1B is a cross-section, exploded-assembly elevation that further illustrates a mating process with the heat spreader 110 depicted in FIG. 1A according to an embodiment. The first heat spreader 110 is mated with a second heat spreader 150, both of which are part of an assembly 100 according to an embodiment. The first heat spreader 110 includes a first die recess 112, a first heat spreader mating surface 114, and a first heat spreader convection channel surface 116. The first heat spreader mating surface 114 can also be referred to as a first heat spreader heat sink side 114. The second heat spreader 150 includes a second die recess 152, a second heat spreader mating surface 154, and a second heat spreader convection channel surface 156. The second heat spreader mating surface 154 can also be referred to as a second heat spreader heat sink side 154. The first heat spreader mating surface 114 and second heat spreader mating surface 154 become parallel and adjacent during the process of mating.

In order to form an integral unit between the first heat spreader 110 and the second heat spreader 150, a bonding material 106 is used to form a joint. In a process embodiment, reflowing of the bonding material 106 is carried out. In an embodiment, the bonding material 106 is a solder paste. In an embodiment, the bonding material 106 is a copper solder paste. In an embodiment, the bonding material 106 is derived from a nano-particulate, i.e., less than or equal to about 50 nanometers (nm) average particle size powder. During reflow, the nano-particulate powder reflows to form a grain size of less than or equal to about 50 micrometers (μm). In an embodiment, the bonding material 106 is a solder paste. In an embodiment, the first heat spreader 110 and the second heat spreader 150 are copper at the respective first and second heat spreader mating surfaces 114 and 154, and the bonding material 106 is also copper such as a nano-particulate copper material.

In an embodiment, the first heat spreader 110 and second heat spreader 150 are each formed by stamping a blank with a stamping die that forms the recesses 112 and 152 and the convection channel surface 116 and 156.

In an embodiment, the first and second TIMs 120 and 158 are each stamped into their respective first and second die recesses 112 and 152 during stamping formation of the respective first and second heat spreaders 110 and 150. In an embodiment, stamping of the respective first and second TIMs 120 and 158 is accomplished after stamping formation of their respective first and second heat spreaders 110 and 150. In an embodiment, placing of the first and second TIMs 120 and 158 in their respective first and second die recesses 112 and 152 is done without stamping, but with a tacking mechanism (such as a heat-fugitive adhesive, a flux, or localized laser tacking) that tacks the first and second TIMs 120 and 158 in their respective first and second die recesses 112 and 152 before further processing.

Figure 1C:
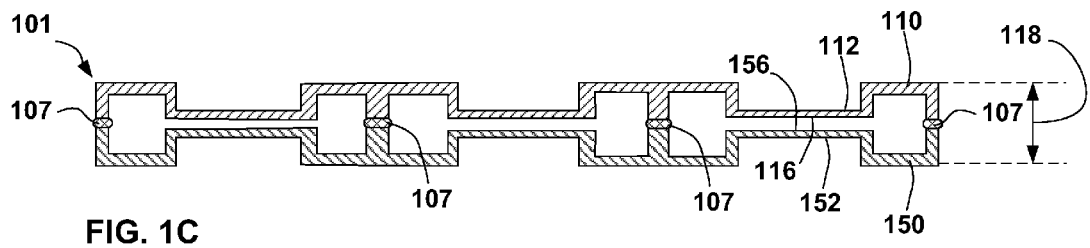
FIG. 1C is a cross-section elevation of an assembly that further illustrates processing depicted in FIG. 1B according to an embodiment.
Figure 6:
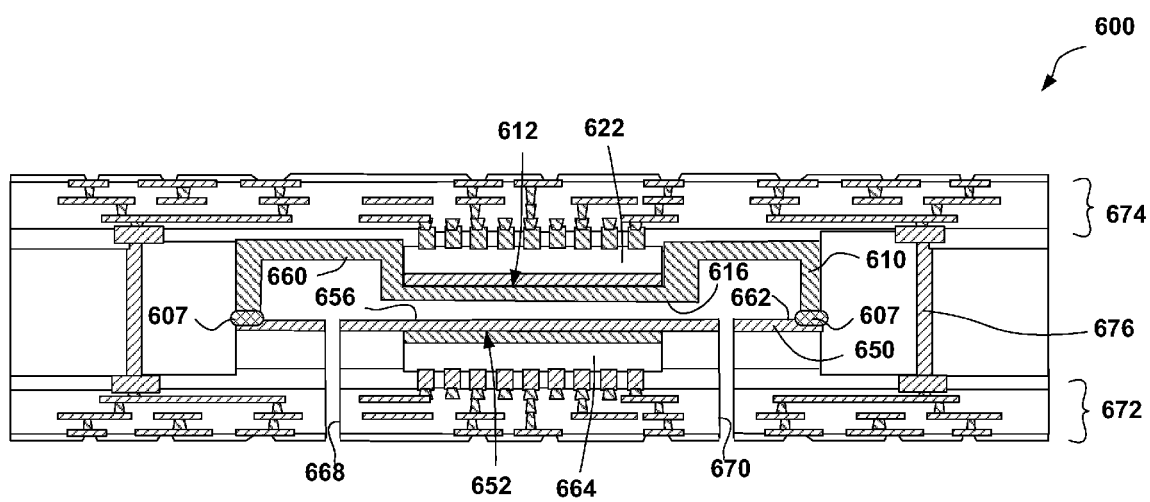
FIG. 6 is a cross-section elevation that illustrates a packaged, dual-chip heat spreader according to an embodiment.

FIG. 1C is a cross-section elevation of an assembly 101 that further illustrates processing depicted in FIG. 1B according to an embodiment. The assembly 101 includes the first heat spreader 110 and the second heat spreader 150 after reflow of the bonding material 106 (FIG. 1B) that has formed a joint 107. Accordingly, an integral, dual-chip heat spreader is formed that includes a convection channel that is defined between the first heat spreader convection channel surface 116 and the second heat spreader convection channel surface 156. The assembly 101 is illustrated as three dual-chip heat-spreader units before singulation. In an embodiment, the assembly 101 has a vertical profile 118 in a range from about 100 μm to about 10 millimeters (mm). In an embodiment, the assembly 101 has a vertical profile 118 in a range from about 800 μm to about 3 mm. In an embodiment, the assembly 101 has a vertical profile 118 in a range from about 1 mm to about 2 mm. Accordingly, for each above embodiment, the respective dice that fit into the die recesses 112 and 152 have vertical profiles that do not exceed the depth of the respective die recesses according to an embodiment. In an embodiment (as illustrated in FIG. 6), only one die has a vertical profile that does not exceed the depth of the die recess.

Figure 1D:
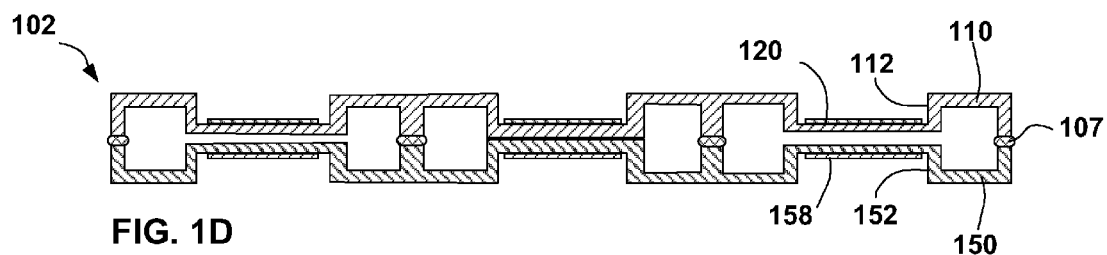
FIG. 1D is a detail cross-section elevation of an assembly that further illustrates processing depicted in FIG. 1C according to an embodiment.

FIG. 1D is a cross-section elevation of an assembly 102 that further illustrates processing depicted in FIG. 1C according to an embodiment. In preparation for the reception of a die in each of the respective first and second heat spreaders 110 and 150, a first thermal interface material (TIM) 120 and a second TIM 158 are placed into the respective first and second recesses 112 and 152.

Figure 1E:
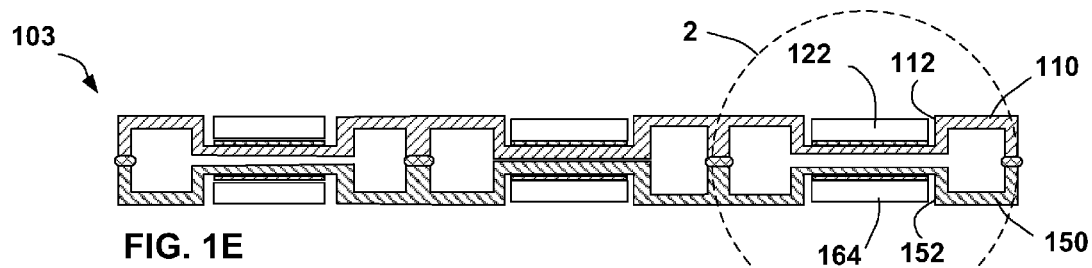
FIG. 1E is a detail cross-section elevation of an assembly that further illustrates processing depicted in FIG. 1D according to an embodiment.

FIG. 1E is a cross-section elevation of an assembly 103 that further illustrates processing depicted in FIG. 1D according to an embodiment. A first die 122 is placed into the first die recess 112 and a second die 164 is placed into the second die recess 152.

Figure 2:
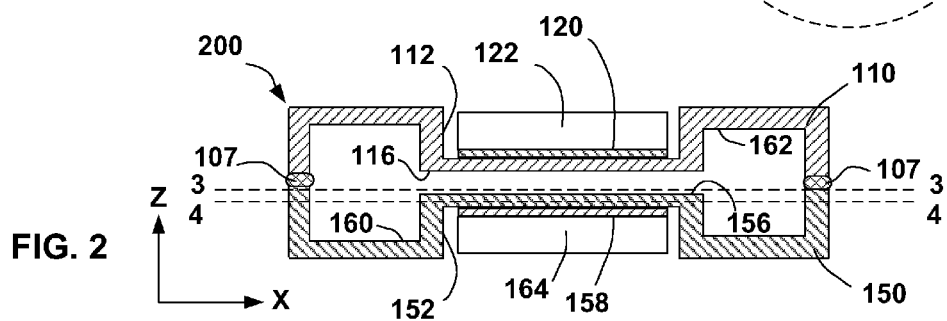
FIG. 2 is a detail cross-section elevation that further illustrates processing depicted in FIG. 1E according to an embodiment.

FIG. 2 is a detail cross-section elevation that further illustrates processing depicted in FIG. 1E according to an embodiment. The detail section is taken from the dashed circle 2 in FIG. 1E.

After singulation of a dual-chip heat spreader from an array, such as depicted in FIG. 1E, an assembly 200 results that includes first heat spreader 110 with the first die recess 112 and the first heat spreader convection channel surface 116. The assembly 200 also includes the second heat spreader 150, the second die recess 152, and the second heat spreader convection channel surface 156. The mating surfaces are subsumed into the joint 107.

According to the depiction in FIG. 2, a heat sink solution is provided in the convection channel formed by the first heat spreader convection channel surface 116 and the second heat spreader convection channel surface 156. Convection is carried out in micro-channel convection channels according to an embodiment. According to a micro-channel embodiment, the vertical dimension (with respect to the orientation of the FIG.) of the micro-channel is in a range from about 10 μm to about 200 μm.

In FIG. 2, the first die 122 has a thickness in a range from about 100 μm to about 1 millimeter. The first TIM 120 disposed between the first die 122 and the first heat spreader 110 has a thickness in a range from about 5 μm to about 100 μm. In an embodiment, the first die 122 has a thickness of about 100 μm and the first TIM 120 has a thickness of about 5 μm.

The assembly 200 also includes a supply reservoir 160 and a reception reservoir 162 Accordingly, a convection fluid can be passed through the convection channel to extract excess heat energy generated by the dice 122 and 160.

Figure 3:
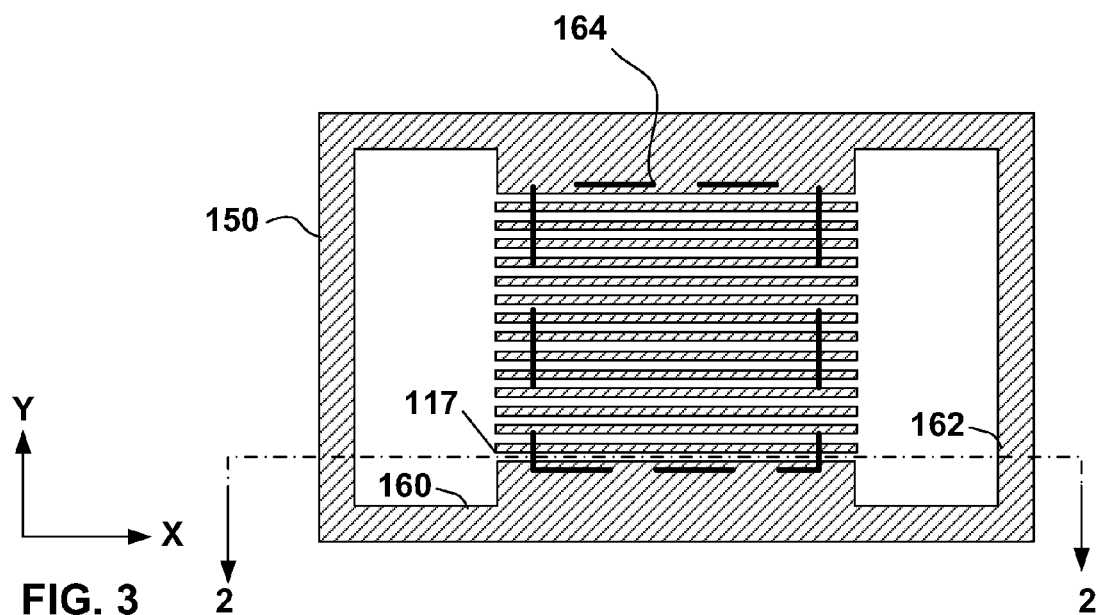
FIG. 3 is a bottom cross-section of a die-footprint on a dual-chip heat spreader according to an embodiment.

FIG. 3 is a bottom cross-section of a die-footprint on a dual-chip heat spreader according to an embodiment. The cross-section is taken along line 3-3 in FIG. 2, as cutting orthogonal to the plane of the FIG. The heat spreader depicted in cross-section is the second heat spreader 150 portion of the assembly 200. A die footprint 164 is a projection of the second die 164 upwards onto the second heat spreader 150. The cross-section reveals a plurality of convection channels, one of which is enumerated with reference numeral 117.

Figure 4:
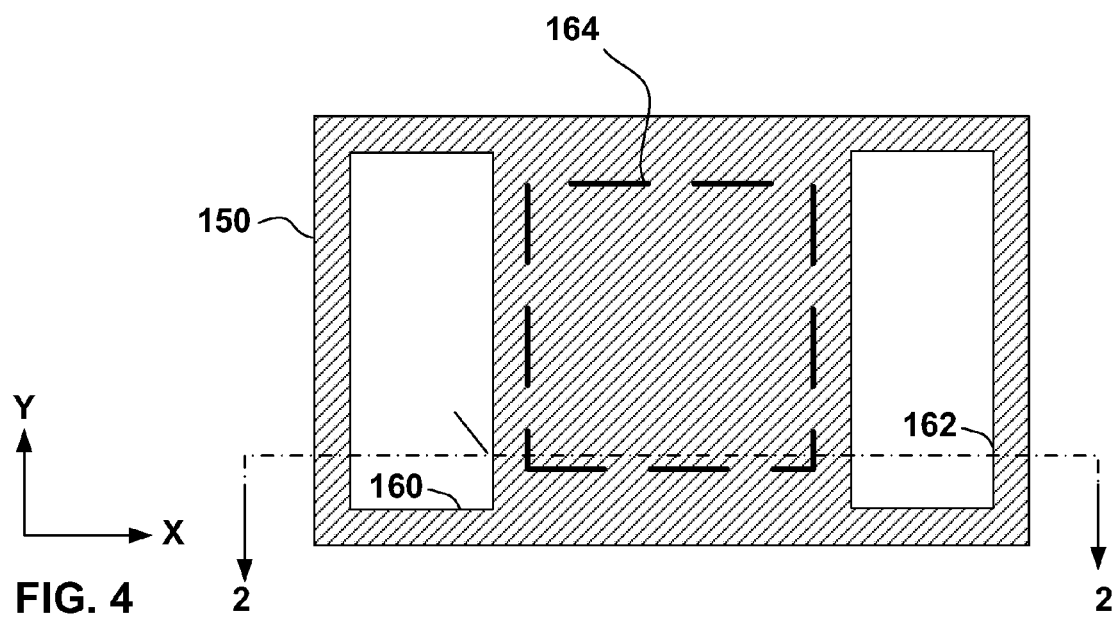
FIG. 4 is a bottom cross-section of a die-footprint on a dual-chip heat spreader according to an embodiment.

FIG. 4 is a bottom cross-section of a die-footprint on a dual-chip heat spreader according to an embodiment. The cross-section is taken along the line 4-4 in FIG. 2, as cutting orthogonal to the plane of the FIG. The heat spreader depicted in cross-section is the second heat spreader 150 portion of the assembly 200. The die footprint 164 is also depicted as a projection of the second die 164 upwards onto the second heat spreader 150. The cross-section reveals a solid structure that is the base of the second die recess 152 depicted in FIG. 1B.

Figure 1F:
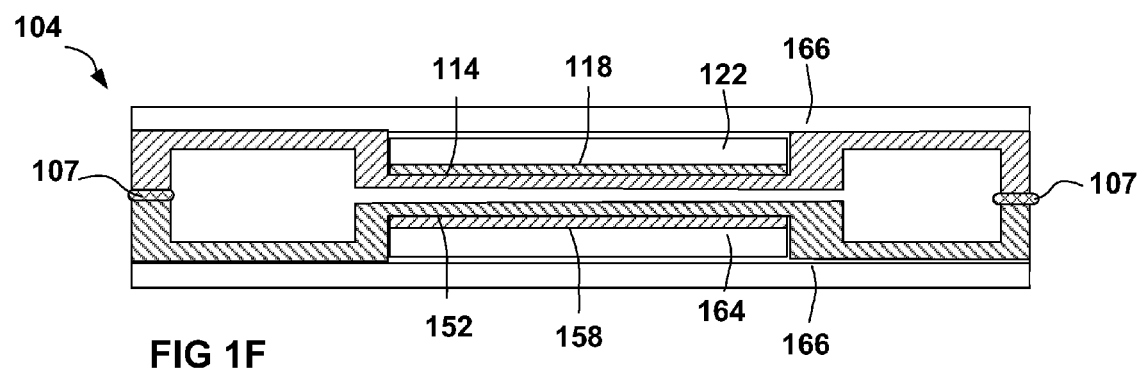
FIG. 1F is a detail cross-section elevation that further illustrates processing depicted in FIG. 1E according to an embodiment.

FIG. 1F is a detail cross-section elevation of an assembly 104 that further illustrates processing depicted in FIG. 1E according to an embodiment. In an embodiment, a thermal process is carried out to reflow the TIMs 120 and 158 such that the respective dice 122 and 164 are bonded in their respective die recesses 112 and 152. In an embodiment, a jig 166 is used to retain dice 122 and 164 during reflow of the TIMs 120 and 158. In an embodiment, reflow of both the joints 107 and the TIMs 120 and 158 are carried out in a single-stage thermal process. In an embodiment, reflow of the joints 107 is carried out with a nano-particulate bonding material 106. Accordingly, the TIM reflow process can follow the formation of the joints 107, or it can be carried out simultaneous with the formation of the joints 107.

Figure 1G:
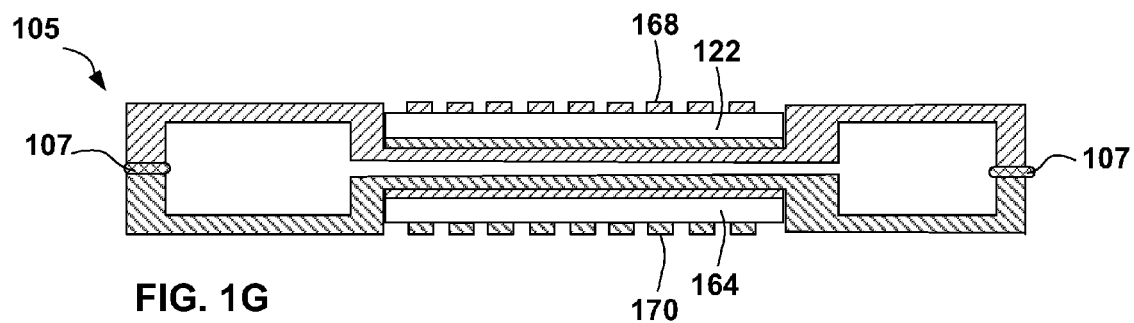
FIG. 1G is a detail cross-section elevation that further illustrates processing depicted in FIG. 1F according to an embodiment.

FIG. 1G is a detail cross-section elevation that further illustrates processing depicted in FIG. 1F according to an embodiment. The assembly 105 illustrates the beginning of forming a bumpless build-up layer (BBUL) on the dice 122 and 164 according to an embodiment. In FIG. 1G, electrical bumps 168 and 170 are formed on the respective first and second dice 122 and 164.

Figure 5:
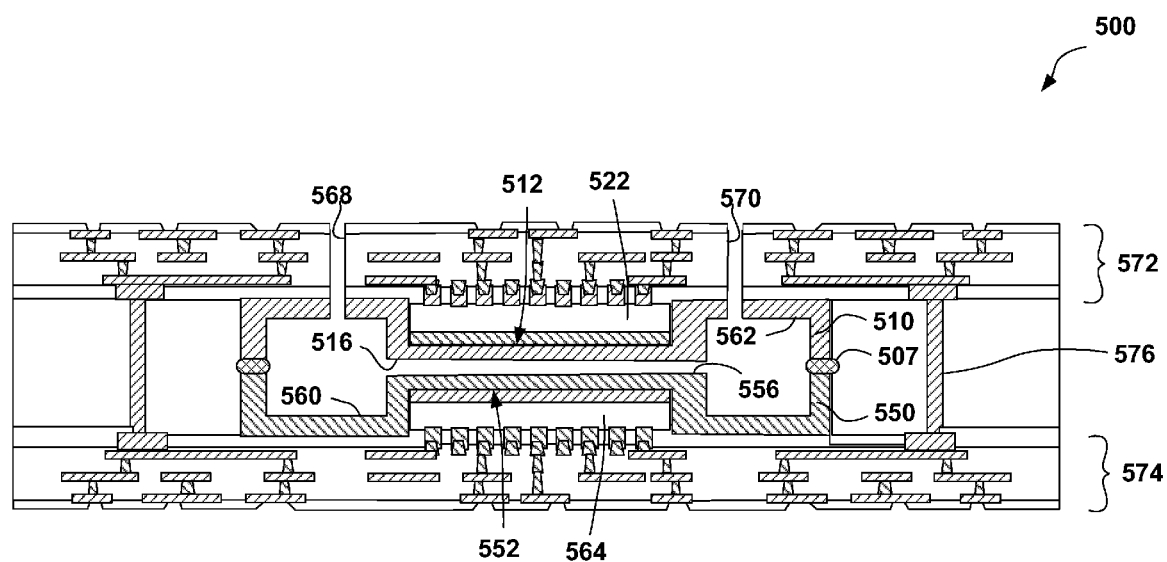
FIG. 5 is a cross-section elevation that illustrates a packaged, dual-chip heat spreader according to an embodiment.

FIG. 5 is a cross-section elevation that illustrates a packaged, dual-chip heat spreader assembly 500 according to an embodiment. A first heat spreader 510 is bonded to a second heat spreader 550 to form dual-chip heat spreader. The first heat spreader 510 and second heat spreader 550 are joined at a joint 507 to make them an integral unit. The dual-chip heat spreader includes a first die recess 512 and a second die site 552. A first die 522 is disposed in the first die recess 512, and a second die 564 is disposed in the second die recess 552.

A convection channel is defined by a first heat spreader convection channel surface 516 and a second heat spreader convection channel surface 556. The assembly 500 also includes a supply reservoir 560 and a reception reservoir 562, which are an integral part of the dual-die heat spreader. Accordingly, a convection fluid can be passed through the convection channel to extract excess heat energy generated by the dice 522 and 564. Convection fluid is supplied to the supply reservoir 560 through a supply channel 568. After heat exchange with the dice, the convection fluid is returned from the reception reservoir 562 through a return channel 570.

In an embodiment, the first die 522 and the second die 564 are electrically coupled between a first BBUL 572 and a second BBUL 574, respectively. As illustrated, a coupling via 576 provides electrical communication between the two dice 522 and 564. In an embodiment, the first die 522 and the second die 564 are each processors, such as a dual-core processing solution with two processors, manufactured by Intel Corporation of Santa Clara, Calif.

FIG. 6 is a cross-section elevation that illustrates a packaged, dual-chip heat spreader assembly 600 according to an embodiment. A first heat spreader 610 is bonded to a second heat spreader 650 to form a dual-chip heat spreader. In this embodiment, the first heat spreader 610 and the second heat spreader 650 can be referred to as a "skillet 650 and lid 610" dual-die heat spreader assembly. When the configuration is vertically inverted, the first heat spreader 610 and the second heat spreader 650 can be referred to as a "pot 610 and lid 650" dual-die heat spreader assembly.

The first heat spreader 610 and second heat spreader 650 are joined at a joint 607 to make them an integral unit. The dual-chip heat spreader includes a first die recess 612 and a second die site 652. In the illustrated embodiment, the second die site 652 is a substantially planar structure, i.e., a "skillet" with the illustrated configuration. A first die 622 is disposed in the first die recess 612 and a second die 660 is disposed at the second die site 652.

A convection channel is defined by a first heat spreader convection channel surface 616 and a second heat spreader convection channel surface 656. The assembly 600 also includes a supply reservoir 660 and a reception reservoir 662, which are integral parts of the dual-die heat spreader. Accordingly, a convection fluid can be passed through the convection channel to extract excess heat energy generated by dice 622 and 664. Convection fluid is supplied to the supply reservoir 660 through a supply channel 668. After heat exchange with the dice, the convection fluid is returned from the reception reservoir 662 through a return channel 670.

In an embodiment, the first die 622 and the second die 664 are electrically coupled between a first BBUL 672 and a second BBUL 674, respectively. As illustrated, a coupling via 676 provides electrical communication between the two dice 622 and 664. In an embodiment, the first die 622 and the second die 664 are each processors, such as a dual-core processing solution with two processors, manufactured by Intel Corporation of Santa Clara, Calif.

Figure 7:
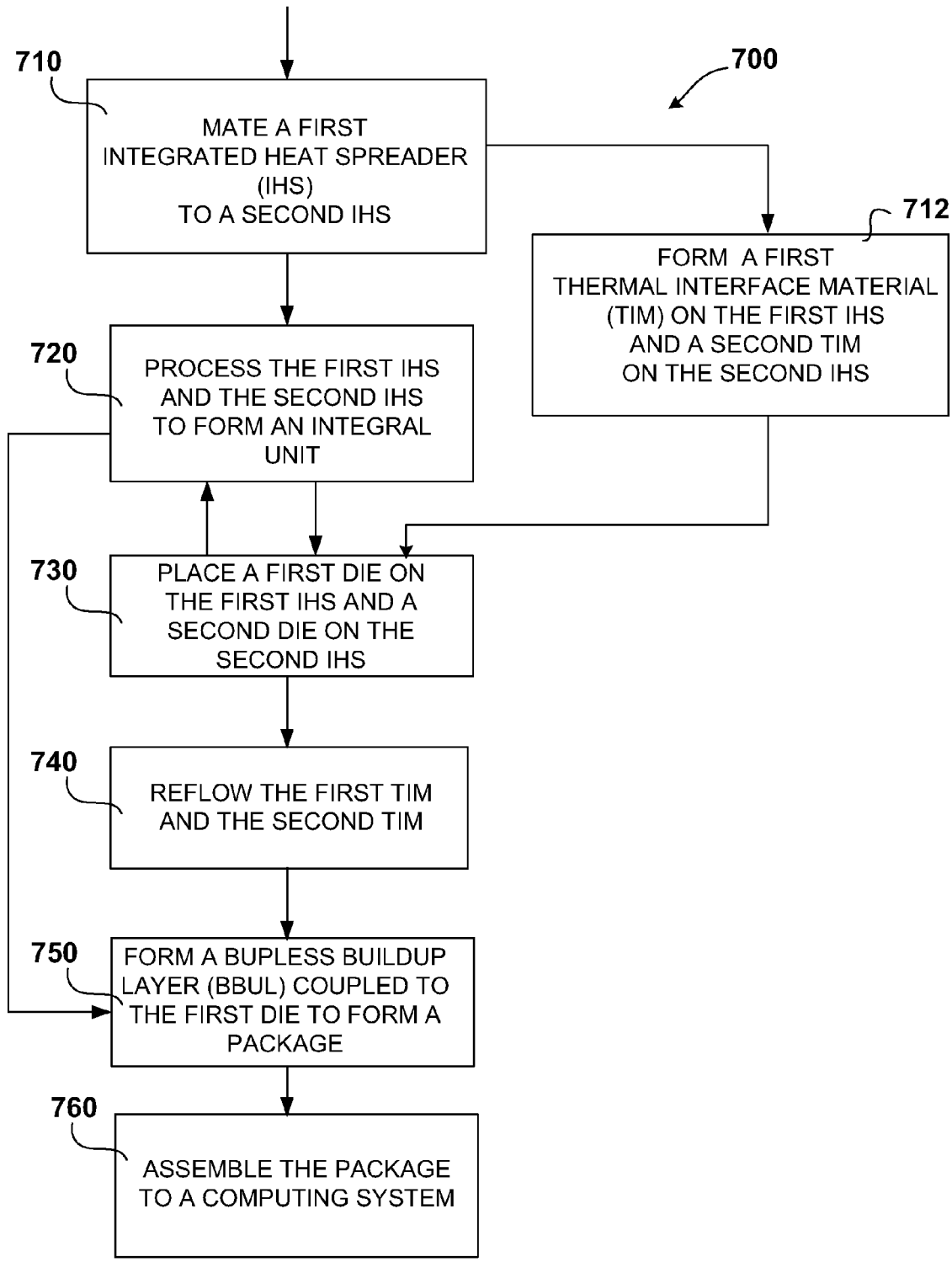
FIG. 7 is a flow chart that describes method flow embodiments.

FIG. 7 is a flow chart 700 that describes method flow embodiments. At 710 the method includes mating a first integrated heat spreader (IHS) to a second IHS.

At 720, the method includes processing the first IHS and the second IHS to form an integral unit.

At 712, the method includes forming a first TIM on the first IHS and a second TIM on the second IHS. As illustrated, this method can precede or follow 720.

At 730 the method includes placing a first die on the first IHS and a second die on the second IHS. In a method embodiment, the process flows from 712 to 730, and follows on to 720.

At 740, the method includes reflowing the first TIM and the second TIM. As illustrated, the reflowing can be carried out during processing at 720.

At 750, the method includes forming a first BBUL coupled to the first die to form a package. The method can also include forming a second BBUL coupled to the second die.

At 760, the method includes assembling the package formed at 750 into a computing system.

Figure 8:
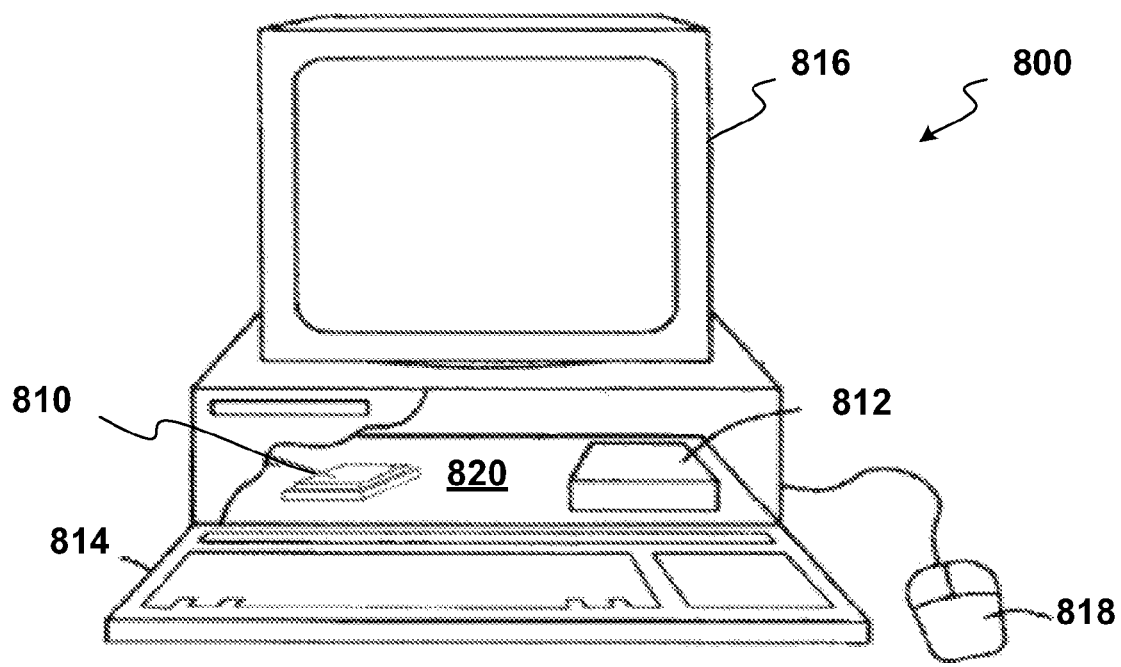
FIG. 8 is a cut-away elevation that depicts a computing system according to an embodiment.

FIG. 8 is a cut-away elevation that depicts a computing system 800 according to an embodiment. One or more of the foregoing embodiments of the dual-die heat spreader assemblies manufactured according to a process embodiment may be utilized in a computing system, such as computing system 800 of FIG. 8. Hereinafter, any dual-die heat spreader assembly manufactured according to a method embodiment alone or in combination with any other embodiment is referred to as an embodiment(s) configuration.

The computing system 800 includes at least one processor (not pictured), which is enclosed in an IC chip package 810, a data storage system 812, at least one input device such as a keyboard 814, and at least one output device such as a monitor 816, for example. The computing system 800 includes a processor that processes data signals and may include, for example, a microprocessor available from Intel Corporation. In addition to the keyboard 814, the computing system 800 can include another user input device such as a mouse 818, for example. The computing system 800 can include a structure, after processing as depicted in FIGS. 2, 5, and 6, of a given dual-die heat spreader assembly manufactured according to a method embodiment.

For purposes of this disclosure, a computing system 800 embodying components in accordance with the claimed subject matter may include any system that utilizes a microelectronic device system, which may include, for example, at least one of the dual-die heat spreader assemblies manufactured according to a method embodiment that is coupled to data storage such as dynamic random access memory (DRAM), polymer memory, flash memory, and phase-change memory. In this embodiment, the embodiment(s) is coupled to any combination of these functionalities by being coupled to a processor. In an embodiment, however, an embodiment(s) configuration set forth in this disclosure is coupled to any of these functionalities. For an example embodiment, data storage includes an embedded DRAM cache on a die. Additionally in an embodiment, the embodiment(s) configuration coupled to the processor (not pictured) is part of the system with an embodiment(s) configuration coupled to the data storage of the DRAM cache. Additionally in an embodiment, an embodiment(s) configuration is coupled to the data storage 812.

In an embodiment, the computing system 800 can also include a die that contains a digital signal processor (DSP), a micro controller, an application specific integrated circuit (ASIC), or a microprocessor. In this embodiment, the embodiment(s) configuration is coupled to any combination of these functionalities by being coupled to a processor. For an example embodiment, a DSP is part of a chipset that may include a stand-alone processor and the DSP as separate parts of the chipset on a board 820. In this embodiment, an embodiment(s) configuration is coupled to the DSP and a separate embodiment(s) configuration may be present that is coupled to the processor in the IC chip package 810. Additionally in an embodiment, an embodiment(s) configuration is coupled to a DSP that is mounted on the same board 820 as the IC chip package 810. It can now be appreciated that the embodiment(s) configuration can be combined as set forth with respect to the computing system 700, in combination with an embodiment(s) configuration as set forth by the various embodiments of the dual-die heat spreader assemblies manufactured according to a method embodiment within this disclosure and their equivalents.

It can now be appreciated that embodiments set forth in this disclosure can be applied to devices and apparatuses other than a traditional computer. For example, a die can be packaged with an embodiment(s) configuration and placed in a portable device such as a wireless communicator or a handheld device such as a personal data assistant and the like. Another example is a die that can be packaged with an embodiment(s) configuration and placed in a vehicle such as an automobile, a locomotive, a watercraft, an aircraft, or a spacecraft.

Figure 9:
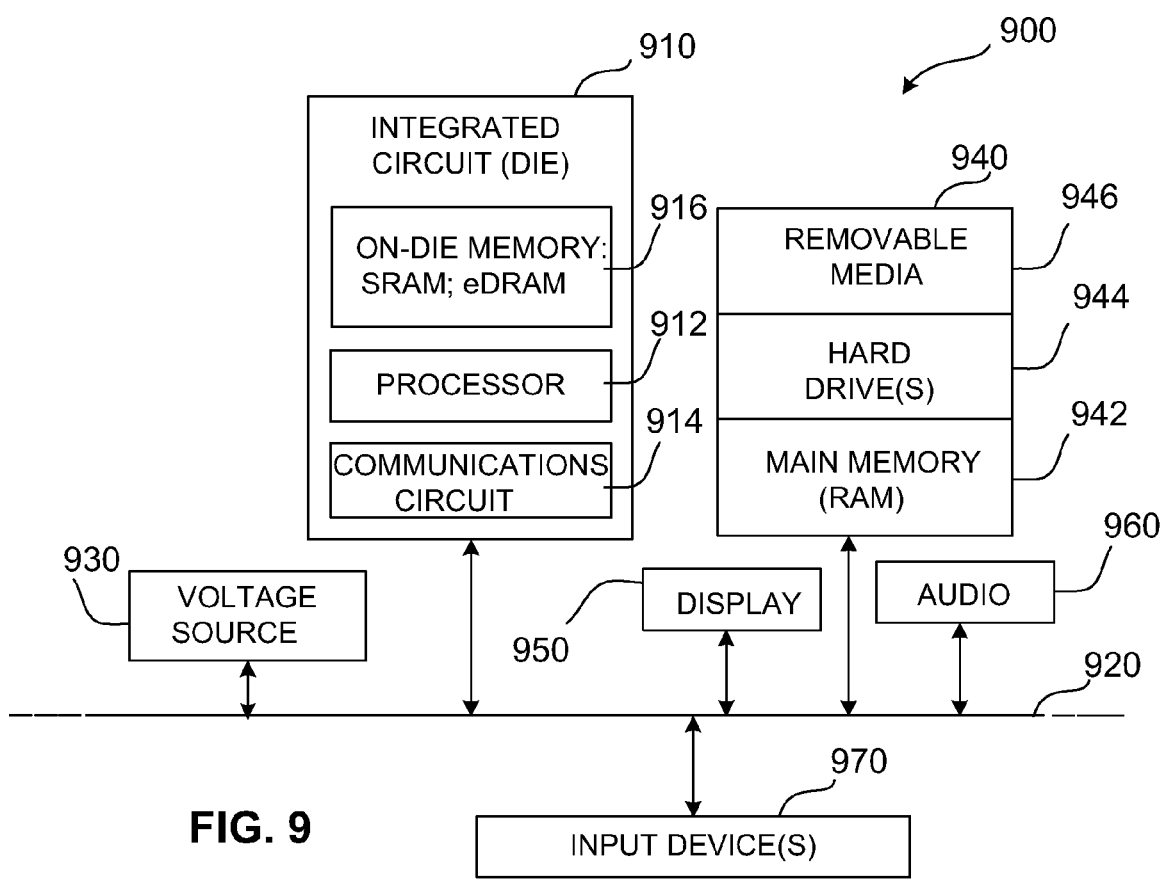
FIG. 9 is a schematic of a computing system according to an embodiment.

FIG. 9 is a schematic of an electronic system 900 according to an embodiment. The electronic system 900 as depicted can embody the computing system 800 depicted in FIG. 8, but the electronic system is depicted more schematically. The electronic system 900 incorporates at least one electronic assembly 910, such as an IC die illustrated in FIGS. 2, 5, and 6. In an embodiment, the electronic system 900 is a computer system that includes a system bus 920 to electrically couple the various components of the electronic system 900. The system bus 920 is a single bus or any combination of busses according to various embodiments. The electronic system 900 includes a voltage source 930 that provides power to the integrated circuit 910. In some embodiments, the voltage source 930 supplies current to the integrated circuit 910 through the system bus 920.

The integrated circuit 910 is electrically coupled to the system bus 920 and includes any circuit or combination of circuits according to an embodiment. In an embodiment, the integrated circuit 910 includes a processor 912 that can be of any type. As used herein, the processor 912 means any type of circuit such as, but not limited to, a microprocessor, a microcontroller, a graphics processor, a digital signal processor, or another processor. Accordingly, a dual-die heat spreader assembly can be part of the electronic system that seats two dice, such as a processor first die and a second die selected from a processor or another die that is part of a chipset. Other types of circuits that can be included in the integrated circuit 910 are a custom circuit or an ASIC, such as a communications circuit 914 for use in wireless devices such as cellular telephones, pagers, portable computers, two-way radios, and similar electronic systems. In an embodiment, the integrated circuit 910 includes on-die memory 916 such as static random-access memory (SRAM). In an embodiment, the integrated circuit 910 includes on-die memory 916 such as embedded dynamic random-access memory (eDRAM).

In an embodiment, the electronic system 900 also includes an external memory 940 that in turn may include one or more memory elements suitable to the particular application, such as a main memory 942 in the form of RAM, one or more hard drives 944, and/or one or more drives that handle removable media 946, such as diskettes, compact disks (CDs), digital video disks (DVDs), flash memory keys, and other removable media known in the art.

In an embodiment, the electronic system 900 also includes a display device 950 and an audio output 960. In an embodiment, the electronic system 900 includes an input 970, such as a keyboard, mouse, trackball, game controller, microphone, voice-recognition device, or any other device that inputs information into the electronic system 900.

As shown herein, integrated circuit 910 can be implemented in a number of different embodiments, including an electronic package, an electronic system, a computer system, one or more methods of fabricating an integrated circuit, and one or more methods of fabricating an electronic assembly that includes the dual-die heat spreader assemblies as set forth herein in the various embodiments and their art-recognized equivalents. The elements, materials, geometries, dimensions, and sequence of operations can all be varied to suit particular packaging requirements.

The Abstract is provided to comply with 37 C.F.R. §1.72(b) requiring an abstract that will allow the reader to quickly ascertain the nature and gist of the technical disclosure. It is submitted with the understanding that it will not be used to interpret or limit the scope or meaning of the claims.

In the foregoing Detailed Description, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate preferred embodiment.

It will be readily understood to those skilled in the art that various other changes in the details, material, and arrangements of the parts and method stages that have been described and illustrated in order to explain the nature of this invention may be made without departing from the principles and scope of the invention as expressed in the subjoined claims.

What is claimed is:

1. A method comprising:
mating a first heat spreader and a second heat spreader, wherein the first heat spreader includes a first die recess and a first heat spreader mating surface, and wherein the second heat spreader includes a second die recess and second heat spreader mating surface, and wherein the first heat spreader mating surface and a second heat spreader mating surface become parallel and adjacent; and processing the first heat spreader and the second heat spreader to form an integral unit dual-chip heat spreader therewith, which includes at least one convection channel configured therebetween and wherein processing includes reflowing a copper nano-particulate joint between the first heat spreader mating surface and the second heat spreader mating surface, and wherein the copper nano-particulate joint forms an average grain size that is less than about 50 micrometer.

2. A method comprising:
mating a first heat spreader and a second heat spreader, wherein the first heat spreader includes a first die recess and a first heat spreader mating surface, and wherein the second heat spreader includes a second die recess and second heat spreader mating surface, and wherein the first heat spreader mating surface and a second heat spreader mating surface become parallel and adjacent; and processing the first heat spreader and the second heat spreader to form an integral unit dual-chip heat spreader therewith, which includes at least one convection channel configured therebetween and wherein the first heat spreader and the second heat spreader include copper, wherein processing includes reflowing a copper nano-particulate joint between the first heat spreader mating surface and the second heat spreader mating surface, and wherein the copper nano-particulate joint forms an average grain size that is less than about 50 micrometer.

3. The method of claim 1, further including:
placing a first die in the first die recess; and
wherein the first die includes a first die active surface and a first die backside surface, and wherein processing includes reflowing a first thermal interface material (TIM) between the first heat spreader first die recess and the first die backside surface.

4. The method of claim 1, further including placing a first die in the first die recess and placing a second die upon the second die recess; and
wherein the first die includes a first die active surface and a first die backside surface, wherein the second die includes a second die active surface and a second die backside surface; and
wherein processing includes reflowing a first thermal interface material (TIM) between the first heat spreader first die recess and the first die backside surface, and reflowing a second TIM between the second heat spreader second die recess and the first die backside surface.

5. The method of claim 1, wherein the second die recess, further including further including placing a first die in the first die recess and placing a second die in the second die recess; and
wherein the first die includes a first die active surface and a first die backside surface, wherein the second die includes a second die active surface and a second die backside surface; and
wherein processing includes reflowing a first thermal interface material (TIM) between the first heat spreader first die recess and the first die backside surface, and reflowing a second TIM between the second heat spreader second die recess and the first die backside surface.

6. The method of claim 1, further including:
forming the first heat spreader by stamping an array that includes the first die recess on a die-side thereof and the first heat spreader mating surface on a heat sink side thereof.

7. A method comprising:
mating a first heat spreader and a second heat spreader, wherein the first heat spreader includes a first die recess and a first heat spreader mating surface, and wherein the second heat spreader includes a second die recess and second heat spreader mating surface, and wherein the first heat spreader mating surface and a second heat spreader mating surface become parallel and adjacent;
processing the first heat spreader and the second heat spreader to form an integral unit dual-chip heat spreader therewith, which includes at least one convection channel configured therebetween;
forming the first heat spreader by stamping an array that includes the first die recess on a die-side thereof and the first heat spreader mating surface on a heat sink side thereof; and
forming the second heat spreader by stamping an array that includes the second die recess on a die-side thereof and the second heat spreader mating surface on a heat sink side thereof.

8. A method comprising:
mating a first heat spreader and a second heat spreader, wherein the first heat spreader includes a first die recess and a first heat spreader mating surface, and wherein the second heat spreader includes a second die recess and second heat spreader mating surface, and wherein the first heat spreader mating surface and a second heat spreader mating surface become parallel and adjacent;
processing the first heat spreader and the second heat spreader to form an integral unit dual-chip heat spreader therewith, which includes at least one convection channel configured therebetween;
placing a first die in the first die recess, wherein the first die includes a first die active surface and a first die backside surface, and wherein processing includes reflowing a first thermal interface material (TIM) between the first heat spreader first die recess and the first die backside surface; and
forming a first bumpless build-up layer (BBUL) that is coupled to the first die.

9. A method comprising:
mating a first heat spreader and a second heat spreader, wherein the first heat spreader includes a first die recess and a first heat spreader mating surface, and wherein the second heat spreader includes a second die recess and second heat spreader mating surface, and wherein the first heat spreader mating surface and a second heat spreader mating surface become parallel and adjacent;
processing the first heat spreader and the second heat spreader to form an integral unit dual-chip heat spreader therewith, which includes at least one convection channel configured therebetween;
placing a first die in the first die recess, wherein the first die includes a first die active surface and a first die backside surface;
placing a second die on the second die recess, wherein the first die includes a first die active surface and a first die backside surface, wherein the second die includes a second die active surface and a second die backside surface, and wherein processing includes reflowing a first thermal interface material (TIM) between the first heat spreader first die recess and the first die backside surface, and reflowing a second TIM between the second heat spreader second die recess and the second die backside surface;
forming a first bumpless build-up layer (BBUL) that is coupled to the first die; and
forming a second bumpless build-up layer (BBUL) that is coupled to the second die.

10. A method comprising:
mating a first heat spreader and a second heat spreader, wherein the first heat spreader includes a first die recess and a first heat spreader mating surface, and wherein the second heat spreader includes a second die recess and second heat spreader mating surface, and wherein the first heat spreader mating surface and a second heat spreader mating surface become parallel and adjacent;
processing the first heat spreader and the second heat spreader to form an integral unit dual-chip heat spreader therewith, which includes at least one convection channel configured therebetween, wherein processing includes reflowing a joint between the first heat spreader mating surface and the second heat spreader mating surface;
placing a first die in the first die recess and placing a second die in the second die recess, wherein the first die includes a first die active surface and a first die backside surface, wherein the second die includes a second die active surface and a second die backside surface;
wherein processing includes reflowing a first thermal interface material (TIM) between the first heat spreader first die recess and the first die backside surface, and reflowing a second TIM between the second heat spreader second die recess and the first die backside surface.

11. The method of claim 10, wherein processing includes reflowing a solder nano-particulate joint between the first heat spreader mating surface and the second heat spreader mating surface, and wherein the solder nano-particulate joint forms an average grain size that is less than about 50 micrometer.

12. The method of claim 10, wherein processing includes reflowing a solder nano-particulate joint between the first heat spreader mating surface and the second heat spreader mating surface, and wherein the solder nano-particulate joint forms an average grain size that is less than about 50 micrometer, and further including:
forming the first heat spreader by stamping an array that includes the first die recess on a die-side thereof and the first heat spreader mating surface on a heat sink side thereof.

13. The method of claim 10, further including:
forming the first heat spreader by stamping an array that includes the first die recess on a die-side thereof and the first heat spreader mating surface on a heat sink side thereof.

14. The method of claim 10, further including:
forming the first heat spreader by stamping an array that includes the first die recess on a die-side thereof and the first heat spreader mating surface on a heat sink side thereof; and
forming the second heat spreader by stamping an array that includes the second die recess on a die-side thereof and the second heat spreader mating surface on a heat sink side thereof.

15. The method of claim 10, further including: forming a first bumpless build-up layer (BBUL) that is coupled to the first die.

16. The method of claim 10, further including:
placing a first die in the first die recess, wherein the first die includes a first die active surface and a first die backside surface;
placing a second die on the second die site, wherein the first die includes a first die active surface and a first die backside surface, wherein the second die includes a second die active surface and a second die backside surface; and
forming a first bumpless build-up layer (BBUL) that is coupled to the first die; and forming a second bumpless build-up layer (BBUL) that is coupled to the second die.

17. A method comprising:
mating a first heat spreader and a second heat spreader, wherein the first heat spreader includes a first die recess and a first heat spreader mating surface, and wherein the second heat spreader includes a second die recess and second heat spreader mating surface, and wherein the first heat spreader mating surface and a second heat spreader mating surface become parallel and adjacent;
forming the first heat spreader by stamping an array that includes the first die recess on a die-side thereof and the first heat spreader mating surface on a heat sink side thereof;
forming the second heat spreader by stamping an array that includes the second die recess on a die-side thereof and the second heat spreader mating surface on a heat sink side thereof
processing the first heat spreader and the second heat spreader to form an integral unit dual-chip heat spreader therewith, which includes at least one convection channel configured therebetween, wherein processing includes reflowing a joint between the first heat spreader mating surface and the second heat spreader mating surface;
placing a first die in the first die recess and placing a second die in the second die recess, wherein the first die includes a first die active surface and a first die backside surface, wherein the second die includes a second die active surface and a second die backside surface; and
wherein processing includes reflowing a first thermal interface material (TIM) between the first heat spreader first die recess and the first die backside surface, and reflowing a second TIM between the second heat spreader second die recess and the first die backside surface.

18. The method of claim 17, wherein the first die includes a first die active surface and a first die backside surface, wherein the second die includes a second die active surface and a second die backside surface, further including:
forming a first bumpless build-up layer (BBUL) that is coupled to the first die; and
forming a second bumpless build-up layer (BBUL) that is coupled to the second die.

* * * * *

UNITED STATES PATENT AND TRADEMARK OFFICE
CERTIFICATE OF CORRECTION

PATENT NO. : 7,659,143 B2  Page 1 of 1
APPLICATION NO. : 11/537522
DATED : February 9, 2010
INVENTOR(S) : Tang et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 323 days.

Signed and Sealed this

Twenty-eighth Day of December, 2010

David J. Kappos
*Director of the United States Patent and Trademark Office*